(12) United States Patent
Choi

(10) Patent No.: US 8,027,192 B2
(45) Date of Patent: Sep. 27, 2011

(54) RESISTIVE MEMORY DEVICES USING ASSYMETRICAL BITLINE CHARGING AND DISCHARGING

(75) Inventor: Byung-Gil Choi, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 115 days.

(21) Appl. No.: 12/544,058

(22) Filed: Aug. 19, 2009

(65) Prior Publication Data

US 2010/0046286 A1    Feb. 25, 2010

(30) Foreign Application Priority Data

Aug. 20, 2008  (KR) .................. 10-2008-0081462
Aug. 20, 2008  (KR) .................. 10-2008-0081466

(51) Int. Cl.
*G11C 11/00* (2006.01)
*G11C 8/00* (2006.01)
*G11C 7/00* (2006.01)
*G11C 8/08* (2006.01)

(52) U.S. Cl. .................. 365/163; 365/230; 365/230.03; 365/230.06; 365/148

(58) Field of Classification Search .................. None
See application file for complete search history.

(56) References Cited

U.S. PATENT DOCUMENTS

| 2004/0022085 A1 | 2/2004 | Parkinson et al. |
| 2007/0217278 A1* | 9/2007 | Uchida ................ 365/230.03 |

FOREIGN PATENT DOCUMENTS

| KR | 1020050018639 A | 2/2005 |
| KR | 1020050058929 A | 6/2005 |
| KR | 1020070082473 A | 8/2007 |

* cited by examiner

*Primary Examiner* — Amir Zarabian
*Assistant Examiner* — James G Norman
(74) *Attorney, Agent, or Firm* — Myers Bigel Sibley & Sajovec, P.A.

(57) ABSTRACT

A nonvolatile memory device includes a plurality of memory banks, each including a plurality of nonvolatile resistive memory cells (e.g. PRAM cells). The device also includes a write global bitline shared by the memory banks and a read global bitline shared by the memory banks. The device further includes a control circuit configured to write data to a selected nonvolatile memory cell in a first memory bank using the write global bitline while reading data from a selected nonvolatile memory cell in a second memory bank using the read global bitline such that a discharge time period of the write global bitline is longer than a quenching time period of a write current which flows through the nonvolatile memory cell of the first memory bank.

6 Claims, 10 Drawing Sheets

RESISTIVE MEMORY DEVICES USING ASSYMETRICAL BITLINE CHARGING AND DISCHARGING

RELATED APPLICATIONS

This application claims priority from Korean Patent Application Nos. 10-2008-0081466 and 10-2008-0081462 filed on Aug. 20, 2008 in the Korean Intellectual Property Office, the disclosure of which is incorporated herein by reference in its entirety.

BACKGROUND OF THE INVENTION

The present invention relates to memory devices and, more particularly, to nonvolatile memory devices using resistive material cells. Nonvolatile memories using resistive materials include phase-change random access memories (PRAMs), resistive RAMs (RRAMs), and magnetic RAMs (MRAMs). While dynamic RAMs (DRAMs) or flash memories typically store data using charge storage, nonvolatile memories having resistive materials typically store data by controlling a state of a phase-change material, such as chalcogenide alloy (in the case of PRAMs), the resistance of a variable resistive material (in the case of RRAMs), or the resistance of a magnetic tunnel junction (MTJ) thin film according to the magnetization state of a ferromagnetic material (in the case of MRAMs).

In particular, the phase-change material of a typical PRAM becomes crystalline or amorphous as it is cooled after being heated. The phase-change material typically has a low resistance in the crystalline state and has a high resistance in the amorphous state. Therefore, the crystalline state may be defined as "set" (or "0"), and the amorphous state may be defined as "reset" (or "1"). As nonvolatile memories have greater storage capacity and become more highly integrated, bitlines of some nonvolatile memories are being implemented using a hierarchical bitline structure having global bitlines and local bitlines. In particular, the global bitlines may be divided into read global bitlines for reading data from nonvolatile memory cells and write global bitlines for writing data to the nonvolatile memory cells. Using such structures, the storage capacity and integration density of the nonvolatile memories may be further increased. Recently, methods of accurately reading data from each nonvolatile memory cell of nonvolatile memories structured as described above are being researched and developed.

SUMMARY

In some embodiments of the present invention, a nonvolatile memory device includes a plurality of memory banks, each including a plurality of nonvolatile resistive memory cells (e.g. PRAM cells). The device also includes a write global bitline shared by the memory banks and a read global bitline shared by the memory banks. The device further includes a control circuit configured to write data to a selected nonvolatile memory cell in a first memory bank using the write global bitline while reading data from a selected nonvolatile memory cell in a second memory bank using the read global bitline such that a discharge time period of the write global bitline is longer than a quenching time period of a write current which flows through the nonvolatile memory cell of the first memory bank. The discharge time period may be at least twice the quenching time period.

In some embodiments, the control circuit includes a write driver circuit including a charge circuit configured to charge the write global bitline and a discharge circuit configured to discharge the write global bitline, wherein a time period during which the write global bitline is discharged by the discharge circuit is longer than a time period during which the write global bitline is charged by the charge circuit. The memory device may include a plurality of local bitlines, respective ones of which are coupled to respective columns of the nonvolatile memory cells in the plurality of memory banks, and the control circuit may include a plurality of write local bitline selection circuits configured to concurrently couple at least two local bitlines to the write global bitline.

Further embodiments of the present invention provide a nonvolatile memory device including a plurality of memory banks, each including a plurality of nonvolatile resistive memory cells and a plurality of write global bitlines shared by the memory banks. The device further includes a control circuit configured to write data to a selected nonvolatile memory cell responsive to a write pulse such that a selected write global bitline receives the write pulse and is charged to a predetermined voltage level and then discharged, wherein a speed at which a level of write current flowing through the selected nonvolatile memory cell is increased in response to the write pulse is dependent on a speed at which the selected write global bitline is charged and wherein a speed at which the level of the write current is reduced is independent of a speed at which the selected write global bitline is discharged. The device may further include a plurality of read global bitlines shared by the memory banks, wherein the control circuit may be configured to write data to the selected nonvolatile memory cell in a first memory bank using the selected write global bitline while reading data from a selected nonvolatile memory cell in a second memory bank using a selected read global bitline.

The control circuit may include a write driver circuit configured to provide the write pulse to the selected write global bitline in response to a write signal and including a charge circuit configured to charge the selected write global bitline and a discharge circuit configured to discharge the selected write global bitline. A time period during which the selected write global bitline is discharged by the discharge circuit may be longer than a time period during which the selected write global bitline is charged by the charge circuit.

The memory device may further include a plurality of local bitlines, respective ones of which are coupled to respective columns of the nonvolatile memory cells of the memory banks. The control circuit may include a write local bitline selection circuit configured to selectively couple the write global bitlines to the local bitlines. A time period in which the selected write global bitline is discharged may at least partially overlap a period in which a selected local bitline is decoupled from the selected write local bitline.

The memory device may further include a plurality of wordlines, respective ones of which are coupled to respective rows of the nonvolatile memory cells of the memory banks. A time period in which a selected wordline coupled to the selected nonvolatile memory cell is disabled may at least partially overlap a period in which the selected write global bitline is discharged.

The memory device may include a plurality of local bitlines, respective ones of which are coupled to respective columns of the nonvolatile memory cells of the memory banks. The control circuit may include a plurality of write local bitline selection circuits configured to selectively couple the write global bitlines to the local bitlines. When data is written to the selected nonvolatile memory cell, the selected write global bitline may be coupled to the selected nonvolatile memory cell by at least two write local bitline selection circuits.

Still further embodiments of the present invention provide a nonvolatile memory device including a plurality of memory banks, each including a plurality of nonvolatile resistive memory cells, a plurality of write global bitlines shared by the memory banks and plurality of local bitlines, respective one of which are coupled to respective columns of the nonvolatile memory cells. The memory device further includes a control circuit including a write local bitline selection circuit configured to selectively couple the write global bitlines to the local bitlines. When data is written to a selected nonvolatile memory cell, a selected write global bitline receives a write pulse and is charged to a predetermined voltage level and then discharged, and a time period in which the selected write global bitline is discharged at least partially overlaps a period in which a selected local bitline is decoupled from the selected write global bitline.

The memory device may further include a plurality of read global bitlines shared by the memory banks. The control circuit may be configured to write data to the selected nonvolatile memory cell in a first memory bank using the selected write global bitline while reading data from a selected nonvolatile memory cell in a second memory bank using a selected read global bitline.

The control circuit may include a write driver circuit configured to provide the write pulse to the selected write global bitline in response to a write signal. The write driver circuit may include a charge circuit configured to charge the selected write global bitline and a discharge circuit configured to discharge the selected write global bitline, wherein a time period during which the selected write global bitline is discharged by the discharge circuit is longer than a time period during which the selected write global bitline is charged by the charge circuit. The charge circuit may include a charge transistor, wherein the discharge circuit includes a discharge transistor and wherein a resistance of the charge transistor is lower than that of the discharge transistor. In further embodiments, the write local bitline selection circuit may be configured to selectively couple the selected write global bitline to a local bitline using the write signal and a write local selection signal.

A time period required to discharge the selected write global bitline may be longer than a time period required to charge the selected write global bitline. When data is written to the selected nonvolatile memory cell using the write pulse, a time period required to discharge the selected write global bitline may be longer than a time period required to discharge the selected local bitline. When the data is written to the selected nonvolatile memory cell, the selected write global bitline may be coupled to the selected nonvolatile memory cell by at least two write local bitline selection circuits.

In additional embodiments of the present invention, a nonvolatile memory device includes a plurality of memory banks, each including a plurality of nonvolatile resistive memory cells, a plurality of write global bitlines shared by the memory banks and plurality of local bitlines, respective ones of which are coupled to respective columns of nonvolatile memory cells of the memory banks. The device further includes a control circuit configured to write data to a selected nonvolatile memory cell using a selected write local bitline such that a time period required to discharge the selected write global bitline is longer than a time period required to discharge a selected local bitline that selectively couples the selected write local bitline to the selected nonvolatile memory cell.

The device may further include a plurality of read global bitlines shared by the memory banks. The control circuit may be configured to write data to a selected nonvolatile memory cell in a first memory bank using the selected write global bitline while reading data from a nonvolatile memory cell in a second memory bank using a selected read global bitline.

The control circuit may include a write driver circuit configured to provide a write pulse to the selected write global bitline in response to a write signal and including a charge circuit configured to charge the selected write global bitline and a discharge circuit configured to discharge the selected write global bitline. The control circuit may further include a write local bitline selection circuit configured to selectively couple the selected write global bitline to the selected local bitline using a write local bitline selection signal and the write signal.

Further embodiments of the present invention provide a nonvolatile memory device including a plurality of memory banks, each including a plurality of nonvolatile resistive memory cells, a plurality of write global bitlines shared by the memory banks and a plurality of local bitlines, respective ones of which are coupled to respective columns of nonvolatile memory cells of the memory banks. The device further includes a control circuit including a write driver circuit configured to provide a write pulse to a selected write global bitline in response to a write signal when data is written to a selected nonvolatile memory cell and a write local bitline selection circuit configured to selectively couple the selected write global bitline to a selected local bitline using a write local bitline selection signal and the write signal. The write driver circuit may include a charge circuit configured to charge the selected write global bitline and a discharge circuit configured to discharge the selected write global bitline, wherein a time period during which the selected write global bitline is discharged by the discharge circuit is longer than a time period during which the selected write global bitline is charged by the charge circuit.

The device may further include a plurality of read global bitlines shared by the memory banks. The control circuit may be configured to write data to the selected nonvolatile memory cell in a first memory bank using the selected write global bitline while reading data from a selected nonvolatile memory cell in a second memory bank using a selected read global bitline.

When data is written to the selected nonvolatile memory cell, the selected write global bitline may be coupled to the selected nonvolatile memory cell by at least two write local bitline selection circuits.

In additional embodiments of the present invention, a nonvolatile memory device includes a plurality of memory banks, each including a plurality of nonvolatile resistive memory cells, a plurality of write global bitlines shared by the memory banks and a plurality of wordlines, respective ones of which are coupled to respective rows of nonvolatile memory cells of the memory banks. The device further includes a control circuit configured to write data to a selected nonvolatile memory cell using a write pulse such that a selected write global bitline receives the write pulse and is charged to a predetermined voltage level and then discharged, wherein a time period in which the selected write global bitline is discharged at least partially overlaps a period in which a selected wordline coupled to the selected nonvolatile memory cell is disabled.

The device may further include a plurality of read global bitlines shared by the memory banks. The control circuit may be configured to write data to the selected nonvolatile memory cell in a first memory bank using the selected write global bitline while reading data from a selected nonvolatile memory cell in a second memory bank using a selected read global bitline.

The control circuit may further include a write driver circuit configured to provide the write pulse to the selected write global bitline in response to a write signal. The write driver circuit may include a charge circuit configured to charge the selected write global bitline and a discharge circuit configured to discharge the selected write global bitline, wherein a time period during which the selected write global bitline is discharged by the discharge circuit is longer than a time period during which the selected write global bitline is charged by the charge circuit. The charge circuit may include a charge transistor, the discharge circuit may include a discharge transistor and a resistance of the charge transistor may be less than that of the discharge transistor.

The control circuit may further include a row decoder configured to disable the selected wordline using a wordline selection signal and the write signal. A time period required to discharge the selected write global bitline may be longer than a time period required to charge the selected write global bitline.

The memory device may further include a plurality of local bitlines. The control circuit may be configured to selective couple the local bitlines to the write global bitlines. Respective ones of the local bitlines may be coupled to respective columns of nonvolatile memory cells of the memory banks. A selected local bitline may receive the write pulse via the selected write global bitline and may be charged to a predetermined voltage level and then discharged. A time period in which the selected local bitline is discharged may at least partially overlap a period in which the selected wordline is disabled.

The control circuit may further include a plurality of write bitline selection circuits configured to selectively couple the write global bitlines to the local bitlines. When data is written to the selected nonvolatile memory cell, the selected write global bitline may be coupled to the selected nonvolatile memory cell by at least two write local bitline selection circuits.

In other embodiments of the present invention, a nonvolatile memory device includes a plurality of memory banks, each including a plurality of nonvolatile resistive memory cells, a plurality of write global bitlines shared by the memory banks and a plurality of wordlines, respective ones of which are coupled to respective rows of the nonvolatile memory cells of the memory banks. The device further includes a control circuit including a write driver circuit configured to provide a write pulse to a selected write global bitline in response to a write signal when data is written to a selected nonvolatile memory cell and a row decoder configured to determine a level of a selected wordline in response to a wordline selection signal and the write signal. The write driver circuit may include a charge circuit configured to charge the selected write global bitline and a discharge circuit configured to discharge the selected write global bitline, wherein a time period during which the selected write global bitline is discharged by the discharge circuit is longer than a time period during which the selected write global bitline is charged by the charge circuit.

The device may further include a plurality of read global bitlines shared by the memory banks. The control circuit may be configured to write data to the selected nonvolatile memory cell in a first memory bank using the selected write global bitline while reading data from nonvolatile memory cell in a second memory bank using a selected read global bitline.

The device may further include a plurality of local bitlines coupled to respective columns of nonvolatile memory cells of the memory banks. The control circuit may include a plurality of local bitline selection circuits configured to selectively couple the write global bitlines to the local bitlines, wherein when data is written to the selected nonvolatile memory cell, the selected write global bitline is coupled to the selected nonvolatile memory cell by at least two write local bitline selection circuits.

DETAILED DESCRIPTION

Figure 1:
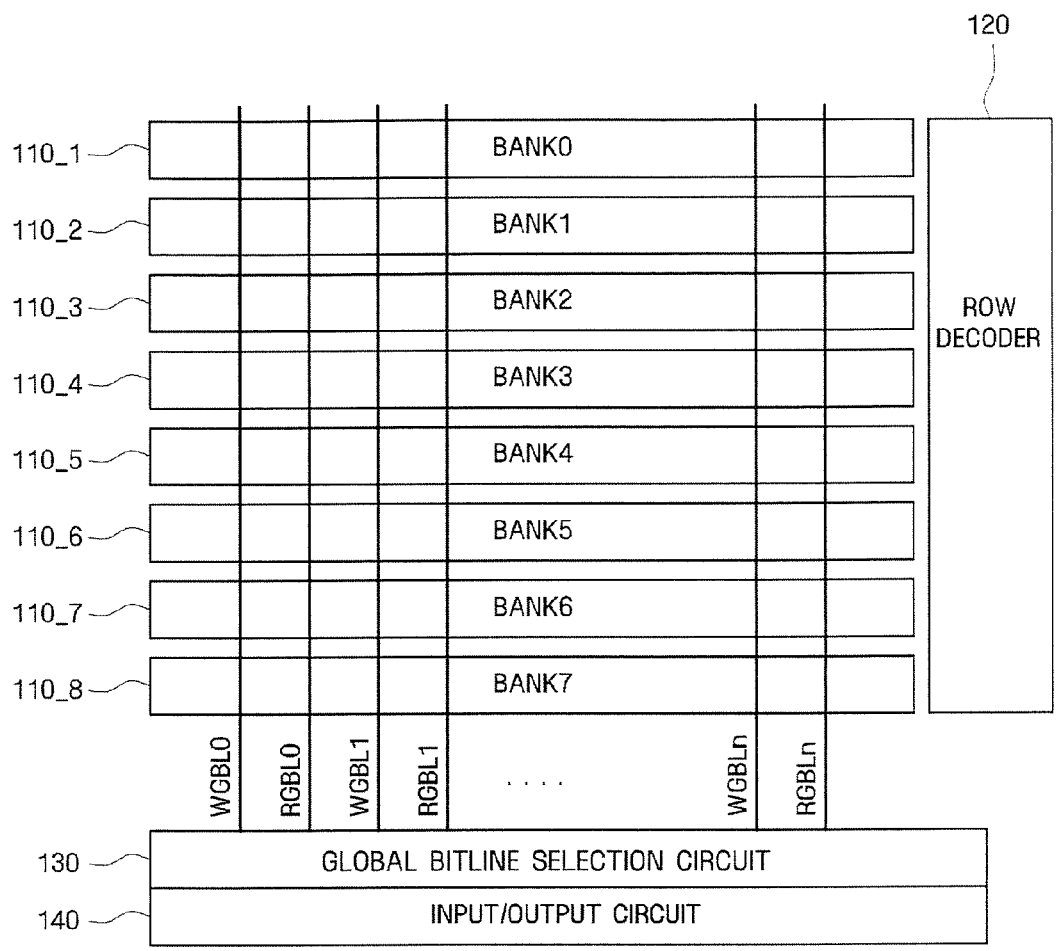
FIGS. 1 and 2 are schematic diagrams illustrating nonvolatile memory devices according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath." "below." "above." "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Hereinafter, exemplary embodiments of the present invention will be described using phase-change random access memories (PRAMs). However, it is obvious to those of ordinary skill in the art to which the present invention pertains that the present invention can be applied to all nonvolatile memories using resistive materials, such as resistive RAMs and ferroelectric RAMs.

Figure 2:
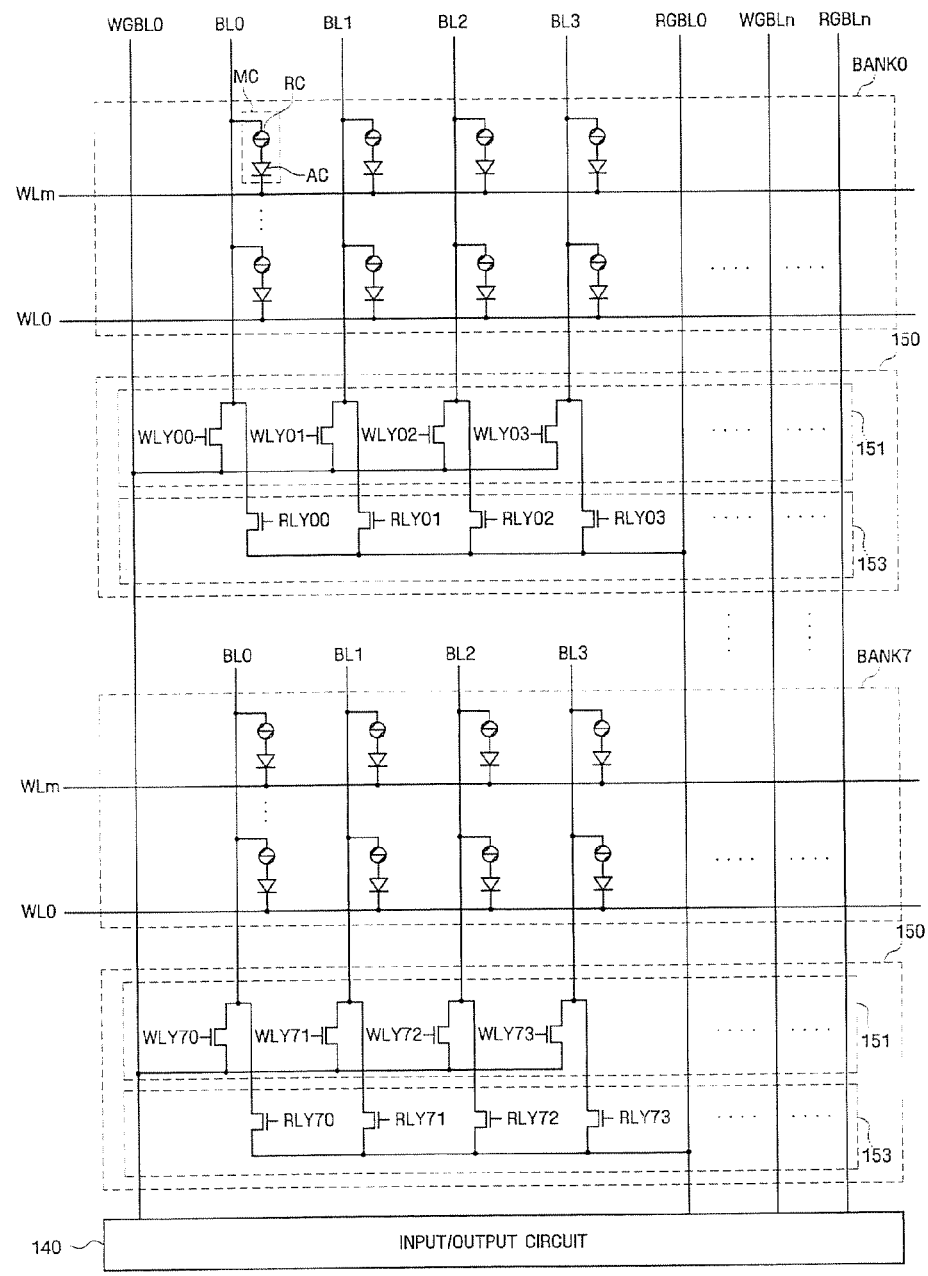

FIGS. 1 and 2 are schematic diagrams illustrating a nonvolatile memory device according to some embodiments of the present invention. In FIGS. 1 and 2, eight memory banks are included in the nonvolatile memory device, and four local bitlines are selectively coupled to each global bitline. However, the present invention is not limited thereto. The number of memory banks included in the nonvolatile memory device and the number of local bitlines coupled to each global bitline can be varied within the scope of the present invention.

Referring to FIGS. 1 and 2, the nonvolatile memory device includes a plurality of memory banks 110_1 through 110_8, a plurality of local bitline selection circuits 150, a global bitline selection circuit 130, a row decoder 120, and an input/output circuit 140. Each of the memory banks 110_1 through 110_8 includes an array of nonvolatile memory cells MC. Rows of the nonvolatile memory cells MC are coupled to wordlines WL0 through WLm, respectively, and columns of the nonvolatile memory cells MC are coupled to local bitlines BL0 through BL3, respectively.

Each of the nonvolatile memory cells MC may include a variable resistor RC and an access device AC. The variable resistor RC includes a phase-change material having different resistance values in a crystalline state and an amorphous state. The access device AC controls electric current that flows through the variable resistor RC. The access device AC may be, for example, a diode or a transistor that is coupled to the variable resistor RC in series. In FIG. 2, a diode is illustrated as the access device AC. However, the present invention is not limited thereto. A phase-change nonvolatile memory cell that uses a diode as the access device AC is referred to as a diode-controlled PRAM cell.

The phase-change material may a combination of two elements, such as GaSb, InSb, InSe. $Sb_2Te_3$ or GeTe, a combination of three elements, such as GeSbTe, GaSeTe, InSbTe, $SnSb_2Te_4$ or InSbGe, or a combination of four elements such as AgInSbTe, (GeSn)SbTe, GeSb(SeTe) or $Te_{81}Ge_{15}Sb_2S_2$. In particular, GeSbTe, which is a combination of germanium (Ge), antimony (Sb) and tellurium (Te), may be mainly used as the phase-change material.

The wordlines WL0 through WLm are coupled to the rows of the nonvolatile memory cells MC, respectively, and are disposed in each of the memory banks 110_1 through 110_8. The wordlines may be implemented in a hierarchical wordline structure having main and sub-wordlines as nonvolatile memories have greater storage capacity and become more highly integrated.

The row decoder 120 controls voltage levels of the wordlines WL0 through WLm and thus selects at least one of the wordlines WL0 through WLm. Specifically, the row decoder 120 may adjust the voltage levels of the wordlines WL0 through WLm to, e.g., a ground voltage level, in response to a row address and thus enable the wordlines WL0 through WLm. In addition, the row decoder 120 may adjust the voltage levels of the wordlines WL0 through WLm to the level of a step-up voltage source VPP_X and thus disable the wordlines WL0 through WLm.

Bitlines may also be implemented in a hierarchical bitline structure having global and local bitlines as nonvolatile memories have greater storage capacity and become more highly integrated. The global bitlines are selectively coupled to the local bitlines BL0 through BL3 by the local bitline selection circuits 150, and each of the local bitlines BL0 through BL3 is coupled to a plurality of nonvolatile memory cells MC.

The global bitlines of the nonvolatile memory device may include write global bitlines WGBL0 through WGBLn and read global bitlines RGBL0 through RGBLn. The write global bitlines WGBL0 through WGBLn are shared by the memory banks 110_1 through 110_8 and are used when data is written to the memory banks 110_1 through 110_8. The read global bitlines RGBL0 through RGBLn are shared by the memory banks 110_1 through 110_8 and are used when data is read from the memory banks 110_1 through 110_8. When the nonvolatile memory device includes the write global bitlines WGBL0 through WGBLn and the read global bitlines RGBL0 through RGBLn shared by the memory banks 110_1 through 110_8, the area of a core structure can be reduced.

When the global bitlines include the write global bitlines WGBL0 through WGBLn and the read global bitlines RGBL0 through RGBLn, each of the local bitline selection circuits 150 may include a write local bitline selection circuit 151 and a read local bitline selection circuit 153. When data is written to one of the memory banks 110_1 through 110_8, the write local bitline selection circuit 151 selectively couples the write global bitlines WGBL0 through WGBLn to the local bitlines BL0 through BL3 by using one of write local bitline selection signals WLY00 through WLY73. When data is read from one of the memory banks 110_1 through 110_8, the read local bitline selection circuit 153 selectively couples the read global bitlines RGBL0 through RGBLn to the local bitlines BL0 through BL3 by using one of read local bitline selection signals RLY00 through RLY73.

In the drawings, the write local bitline selection circuit 151 and the read local bitline selection circuit 153 are disposed adjacent a first side of each of the memory banks 110_1 through 110_8. However, the present invention is not limited thereto. In other embodiments of the present invention, the write local bitline selection circuit 151 and the read local bitline selection circuit 153 may be disposed adjacent an opposite side of each of the memory banks 110_1 through 110_8.

Figure 6:
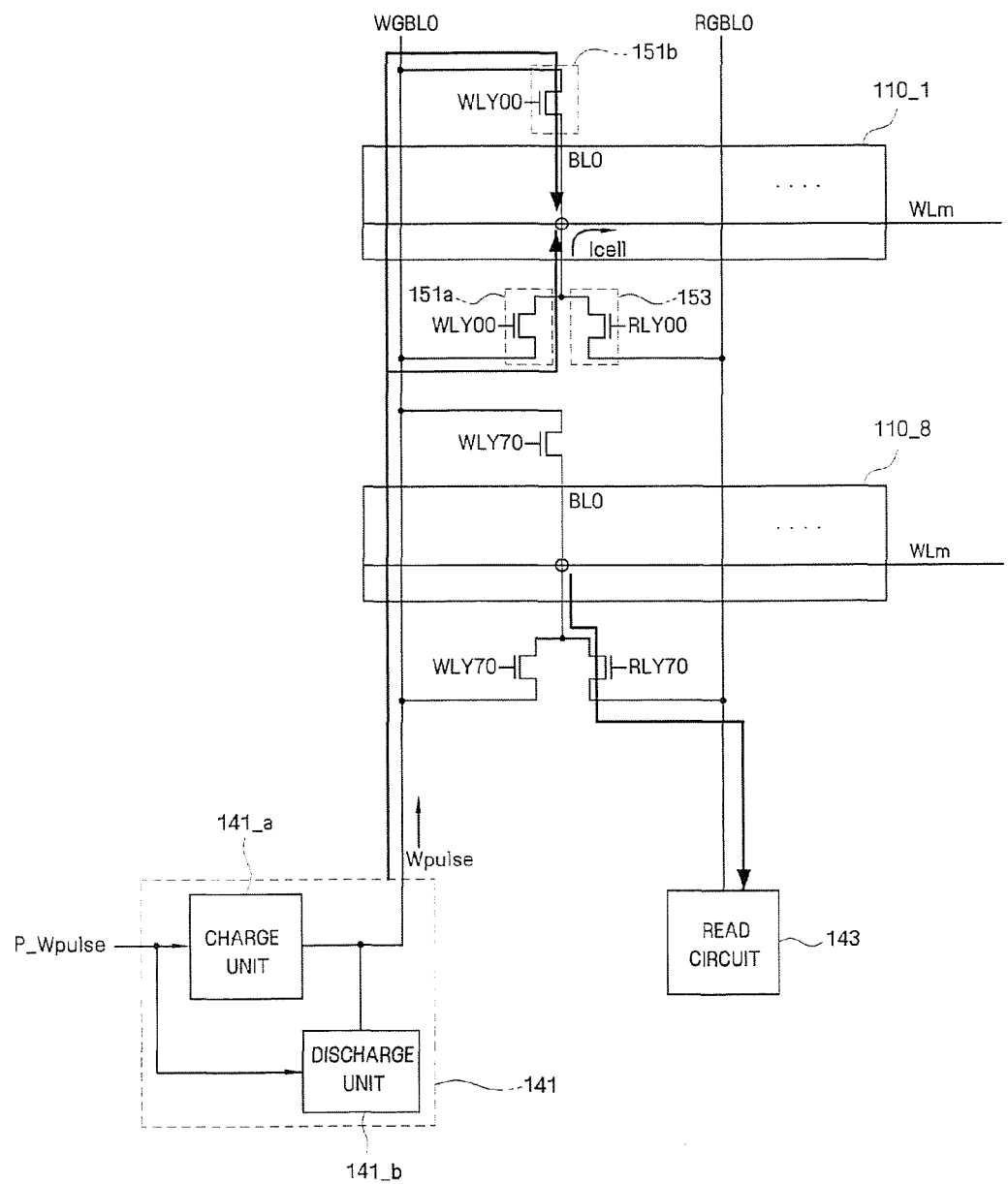
FIG. 6 is a schematic diagram illustrating write operations and read operations of a nonvolatile memory device according to further embodiments of the present invention.

In a nonvolatile memory device according to further embodiments of the present invention, the write local bitline selection circuit 151 and the read local bitline selection circuit 153 may be disposed as shown in FIG. 6. Specifically, in such embodiments, one read local bitline selection circuit may correspond to each of the memory banks 110_1 through 110_8 while two or more write local bitline selection circuits correspond to each of the memory banks 110_1 through 110_8, which will be described in detail later with reference to FIG. 6.

Referring again to FIG. 2, the input/output circuit 140 is coupled to the write global bitlines WGBL0 through WGBLn to input data to the memory banks 110_1 through 110_8. In addition, the input/output circuit 140 is coupled to the read global bitlines RGBL0 through RGBLn to output data from the memory banks 110_1 through 110_8. The input/output circuit 140 includes a write circuit and a read circuit.

The write circuit is coupled to the write global bitlines WGBL0 through WGBLn to write data to the memory banks 110_1 through 110_8 and includes a data input buffer and a write driver circuit. The data input buffer receives external data, buffers the received data, and provides the buffered data to the write driver circuit. The write driver circuit receives the buffered data and writes the received data to selected ones of the nonvolatile memory cells MC in the memory banks 110_1 through 110_8.

The read circuit is coupled to the read global bitlines RGBL0 through RGBLn to read data from the memory banks 110_1 through 110_8 and includes a sense amplifier and a data output buffer. The sense amplifier reads data from selected ones of the nonvolatile memory cells MC in the memory banks 110_1 through 110_8, and the data output buffer outputs the read data.

Figure 3:
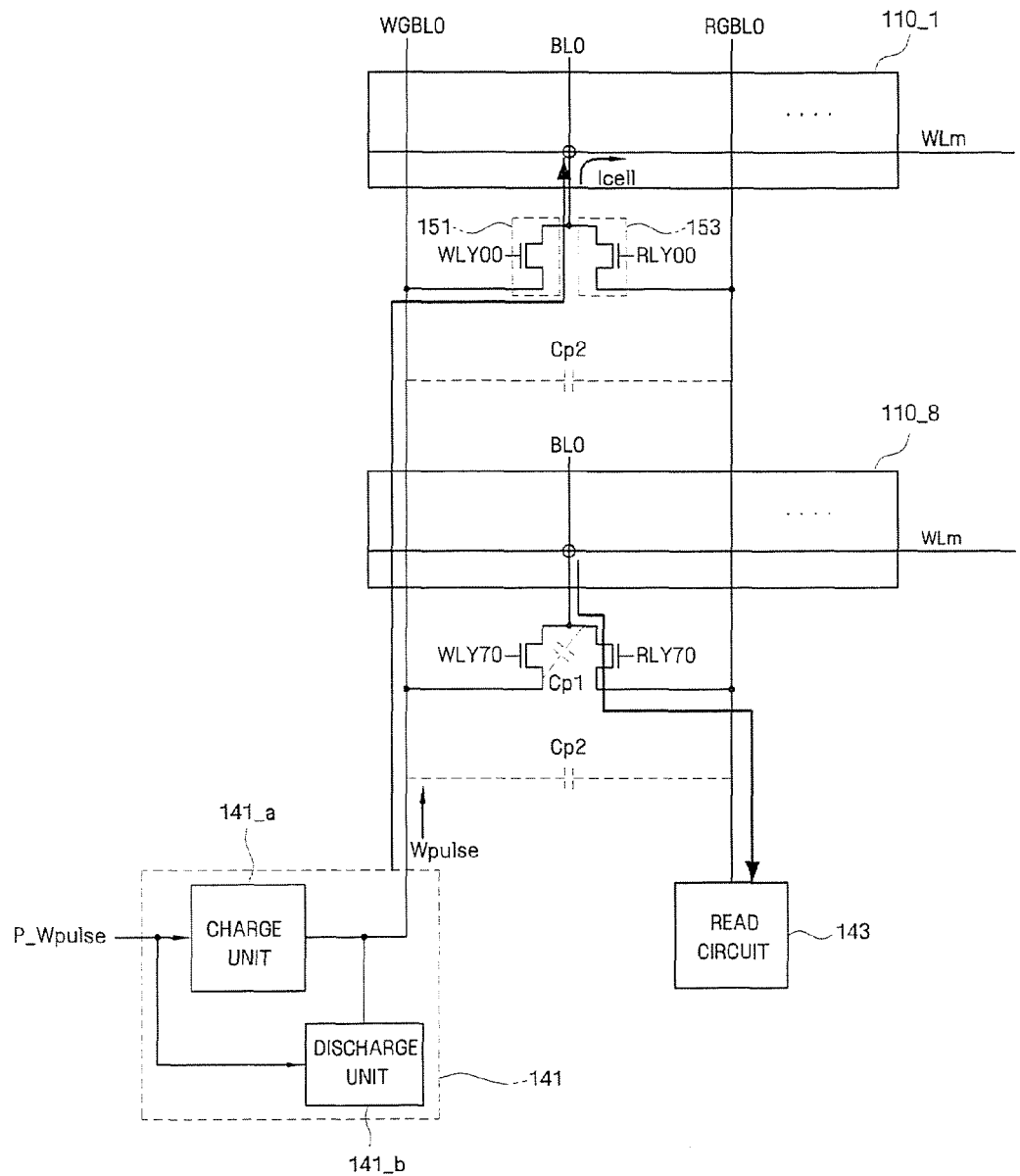
FIG. 3 is a schematic diagram illustrating write operations and read operations of a nonvolatile memory device according to some embodiments of the present invention.
Figure 4:
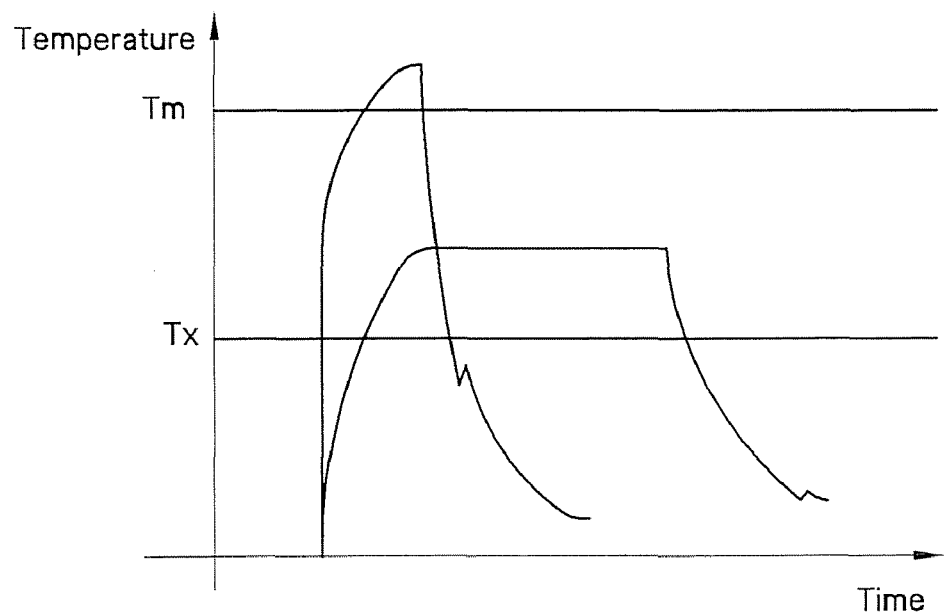
FIG. 4 is a graph illustrating operations for changing a state of a phase-change material of a nonvolatile memory cell during a write operation according to some embodiments of the present invention.
Figure 5:
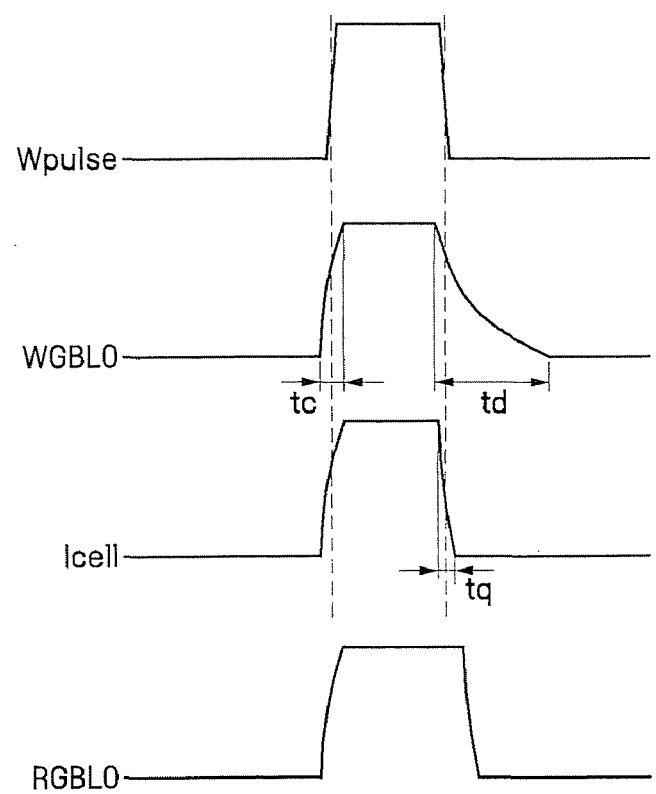
FIG. 5 is a timing diagram illustrating operations of a nonvolatile memory device according to some embodiments of the present invention.

FIG. 3 is a diagram illustrating write and read operations of a nonvolatile memory device according to some embodiments of the present invention. For simplicity of illustration, the global bitline selection circuit 130 is omitted in FIG. 3. FIG. 4 is a graph illustrating conditions for phase-changing the phase-change material of each nonvolatile memory cell MC during a write operation. FIG. 5 is a timing diagram illustrating operations of a nonvolatile memory device. In FIG. 5, a case where a reset pulse having a relatively high peak level and a relatively narrow pulse width is provided will be described as an example. However, the present invention is not limited thereto. In addition, a case where a write pulse having a high peak level is provided will be described as an example. However, the present invention is not limited thereto.

Referring to FIGS. 1 through 5, a nonvolatile memory device according to some embodiments writes and/or reads data to/from the memory banks 110_1 through 110_8. The nonvolatile memory device does not concurrently write and read data to/from the same memory bank. Instead, the nonvolatile memory device independently writes and reads data to/from different memory banks. For example, the nonvolatile memory device may write data to a first memory bank (e.g. the memory bank 110_1) while reading data from a second memory bank (e.g. the memory bank 110_8).

In the write operation and/or the read operation of the nonvolatile memory device, the row decoder 120 selects a wordline (e.g., the wordline WLm), and the write local bitline selection circuit 151 and the global bitline selection circuit 130 select a local bitline (e.g., the local bitline BL0) and a write global bitline (e.g. the write global bitline WGBL0), respectively. Consequently, nonvolatile memory cells MC to be written are selected. Similarly, the row decoder 120 selects a wordline (e.g., the wordline WLm), and the read local bitline selection circuit 153 and the global bitline selection circuit 130 (see FIG. 1) select a local bitline (e.g., the local bitline BL0) and a read global bitline (e.g. the read global bitline RGBL0), respectively. Consequently, nonvolatile memory cells MC to be read are selected. In particular, when the nonvolatile memory cells MC are diode-controlled PRAM cells, the voltage level of the selected wordline (e.g., the wordline Wm) is adjusted to the ground voltage level, so that diodes of the nonvolatile memory cells MC can be turned on.

In FIG. 3, the write global bitlines WGBL0 through WGBLn are coupled to the local bitlines BL0 through BL3 by the write local bitline selection circuit 151 corresponding to the memory banks 110_1 through 110_8. Thus, one current path is formed between each of the write global bitlines WGBL0 through WGBLn and the nonvolatile memory cells MC. However, the present invention is not limited thereto. For example, a nonvolatile memory device according to further embodiments of the present invention may operate as shown in FIG. 6, wherein two write current paths may be provided.

FIG. 6 is a diagram illustrating a nonvolatile memory device and operations thereof according to another exemplary embodiment of the present invention. In the embodiments of FIG. 6, when the nonvolatile memory device writes data to nonvolatile memory cells MC, the write global bitlines WGBL0 through WGBLn may be selectively coupled to a plurality of local bitlines BL0 through BL3 by two or more write local bitline selection circuits 151a and 151b which correspond to each of a plurality of memory banks 110_1 through 110_8. Thus, two or more current paths may be formed between each of the write global bitlines WGBL0 through WGBLn and the nonvolatile memory cells MC. A nonvolatile memory device according to some embodiments may thus provide sufficient current through the nonvolatile memory cells MC during a write operation and thus perform the write operation in a more stable manner.

In order to read data from a second memory bank (e.g., the memory bank 110_8 of FIG. 3), the nonvolatile memory device may provide read current to the nonvolatile memory cells MC of the second memory bank and use the change in voltage levels of the read global bitlines RGBL0 through RGBLn which is caused by the read current. Specifically, a read circuit 143 provides the read current Icell to the nonvolatile memory cells MC. A sense amplifier included in the read circuit 143 senses the change in the voltage levels of the read global bitlines RGBL0 through RGBLn, which is caused by the read current, and thus reads data from the nonvolatile memory cells MC of the second memory bank.

In order to write data to a first memory bank (e.g. the memory bank 110_1), a write driver circuit 141 may use a write pulse Wpulse which is applied to the write global bitlines WGBL0 through WGBLn and use joule heat which is generated by write current Icell that flows through the nonvolatile memory cells MC. Specifically, as shown in FIG. 4, a reset pulse may be provided to the write global bitlines WGBL0 through WGBLn so that a first logic level, e.g, reset data, can be written to the nonvolatile memory cells MC. Phase-change materials of the nonvolatile memory cells MC are heated above a melting temperature Tm and then quickly cooled. As a result, the phase-change materials of the nonvolatile memory cells MC become amorphous. Similarly, a set pulse may be provided to the write global bitlines WGBL0 through WGBLn so that a second logic level, e.g, set data, can be written to the nonvolatile memory cells MC. The phase-change materials of the nonvolatile memory cells MC are heated to a temperature which is higher than a crystallization temperature Tx and lower than the melting temperature Tm. The phase-change materials of the nonvolatile memory cells MC are maintained at the temperature for a predetermined period of time and then quickly cooled. As a result, the phase-change materials of the nonvolatile memory cells MC become crystalline.

A peak level of the set pulse may be lower than that of the reset pulse, and a width of the set pulse may be greater than that of the reset pulse, where a peak level refers to a maximum current level of each write pulse. The set pulse may be a current pulse having a level that is maintained at a peak level for a predetermined period of time and then reduced along a predetermined slope or a current pulse having a level that is reduced through a plurality of sequential stages.

A nonvolatile memory device according to some embodiments may write data to the nonvolatile memory cells MC of a first memory bank of the memory banks 110_1 through 110_8, by using the write global bitlines WGBL0 through WGBLn while reading data from the nonvolatile memory cells MC of a second memory bank of the memory banks 110_1 through 110_8, by using the read global bitlines RGBL0 through RGBLn. In this case, the levels of the write pulse Wpulse, the write global bitlines WGBL0 through WGBLn, the write current Icell, and the read global bitlines RGBL0 through RGBLn may change as shown in FIG. 5. Specific operations for causing the levels of the write pulse Wpulse, the write global bitlines WGBL0 through WGBLn, the write current Icell and the read global bitlines RGBL0 through RGBLn to change as shown in FIG. 5 will be described in detail later with reference to FIGS. 8 through 11.

Referring to FIG. 5, the level of write current Icell used in a write operation for a nonvolatile memory device according to some embodiments occurs responsive to the level of the write pulse Wpulse. The voltage levels of the write global bitlines WGBL0 through WGBLn are substantially independent of the level of the write pulse Wpulse. That is, a charge circuit 141_a of a write driver circuit 141 charges the write global bitlines WGBL0 through WGBLn to a predetermined voltage level, and a discharge circuit 141_b of the write driver circuit 141 discharges the write global bitlines WGBL0 through WGBLn from the predetermined voltage level, independently of the level of the write pulse Wpulse.

The speed at which the write global bitlines WGBL0 through WGBLn of the nonvolatile memory device are charged may be dependent on the speed at which the write pulse Wpulse changes from, for example, a low level to a high level. However, the speed at which the write global bitlines WGBL0 through WGBLn are discharged may be independent of the speed at which the write pulse Wpulse changes from, for example, a high level to a low level. In addition, the speed at which the level of the write current Icell flowing through the nonvolatile memory cells MC is increased in response to the write pulse Wpulse may be dependent on the speed at which the write global bitlines WGBL0 through WGBLn are charged. However, the speed at which the level of the write current Icell is reduced may be substantially independent of the speed at which the write global bitlines WGBL0 through WGBLn are discharged.

An increase in the level of the write pulse Wpulse from a low level to a high level may affect the charging of the write global bitlines WGBL0 through WGBLn and the speed at which the level of the write current Icell is increased. However, a decrease in the level of the write pulse Wpulse from a high level to a low level may not affect the discharging of the write global bitlines WGBL0 through WGBLn and the speed at which the level of the write current Icell is reduced.

Furthermore, a discharge time Td of the write global bitlines WGBL0 through WGBLn of the nonvolatile memory device may be longer than a charge time tc of the write global bitlines WGBL0 through WGBLn. The charge time tc of the write global bitlines WGBL0 through WGBLn may refer to a period of time during which the write global bitlines WGBL0 through WGBLn are charged to a predetermined voltage level by the charge circuit 141_a. The discharge time td of the write global bitlines WGBL0 through WGBLn may refer to a period of time during which the write global bitlines WGBL0 through WGBLn are discharged from a predetermined voltage level by the discharge circuit 141_b.

When the set pulse, which includes a current pulse maintained at a peak level for a predetermined period of time and then reduced along a predetermined slope or a current pulse reduced through a plurality of sequential stages, is provided as well as when the reset pulse having a relatively high peak level and a relatively narrow pulse width is provided, the charge time tc required to charge the write global bitlines WGBL0 through WGBLn to a predetermined voltage level may be shorter than the discharge time td required to discharge the write global bitlines WGBL0 through WGBLn from the predetermined voltage level.

The discharge time td of the write global bitlines WGBL0 through WGBLn of the nonvolatile memory device according to some embodiments may be longer than a quenching time tq of the write current Icell that flows through the nonvolatile memory cells MC of the first memory bank (one of the memory banks 110_1 through 110_8). For example, the discharge time td may be more than at least twice the quenching time tq. Therefore, the write global bitlines WGBL0 through WGBLn can be discharged sufficiently slowly while the write current Icell flowing through the nonvolatile memory cells MC is quenched relatively quickly. The quenching time tq may refer to a period of time during which the level of the write current Icell flowing through the nonvolatile memory cells MC is reduced from a predetermined level.

When the write global bitlines WGBL0 through WGBLn are charged to a predetermined voltage level and then discharged in response to the write pulse Wpulse, the voltage levels of the write global bitlines WGBL0 through WGBLn may not be reduced sharply. Instead, the voltage levels of the write global bitlines WGBL0 through WGBLn may be slowly reduced over a predetermined period of time. Unlike the write global bitlines WGBL0 through WGBLn, the level of the write current Icell is adjusted according to the level of the set pulse or the reset pulse. In particular, when the reset pulse is provided, the level of the write current Icell may be reduced sharply within a short time.

In this regard, a nonvolatile memory device according to some embodiments can write not only set data but also reset data, which may require a very short quenching time, to the nonvolatile memory cells MC in a stable manner. In addition, when the nonvolatile memory device writes data to the nonvolatile memory cells MC of the first memory bank by using the write global bitlines WGBL0 through WGBLn while reading data from the nonvolatile memory cells MC of the second memory bank by using the read global bitlines RGBL0 through RGBLn, errors can be reduced, which will be described in detail with reference to FIGS. 3, 7A and 7B.

Figure 7A:
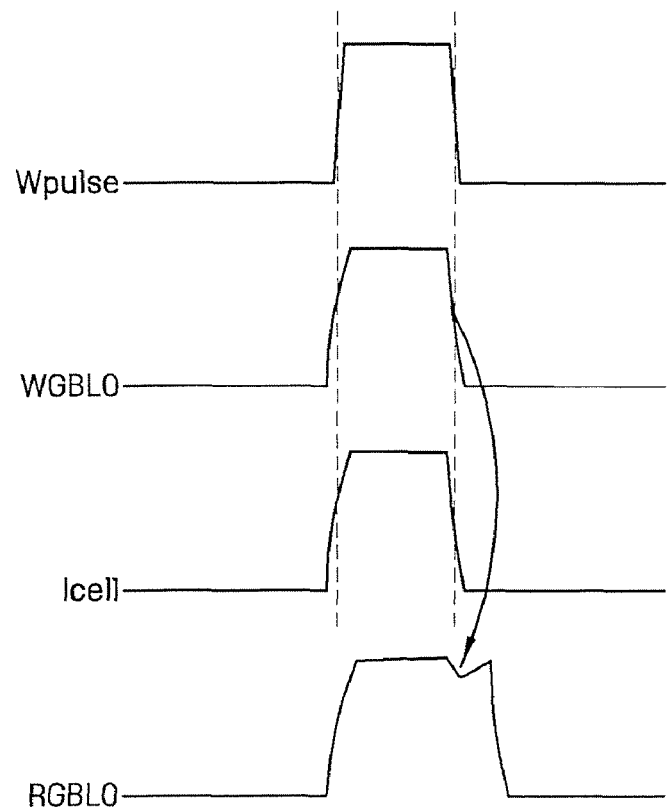
FIGS. 7A and 7B are a timing diagram and a graph, respectively, illustrating read errors of read global bitlines in a conventional nonvolatile memory device.
Figure 7B:
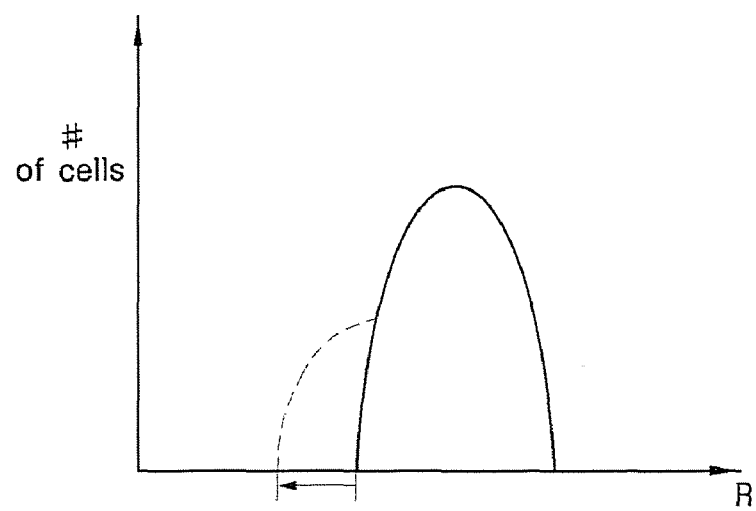

FIGS. 7A and 7B are diagrams illustrating read errors of read global bitlines in a conventional nonvolatile memory device which are caused by write global bitlines. Referring to FIGS. 3, 7A and 7B, voltage levels of the write global bitlines WGBL0 through WGBLn in the conventional nonvolatile memory device are adjusted according to the level of a write pulse Wpulse. Specifically, as the write pulse Wpulse changes from a low level to a high level, the write global bitlines WGBL0 through WGBLn are charged to a predetermined voltage level from a ground voltage level. In addition, as the write pulse Wpulse changes from a high level to a low level, the write global bitlines WGBL0 through WGBLn are discharged from the predetermined voltage level to the ground voltage level.

The amount of write current Icell flowing through nonvolatile memory cells MC, which are coupled to the write global bitlines WGBL0 through WGBLn, can be adjusted. Specifically, as the write pulse Wpulse changes from a low level to a high level, the write global bitlines WGBL0 through WGBLn are charged, thereby increasing the amount of the write current Icell. As the write pulse Wpulse changes from a high level to a low level, the write global bitlines WGBL0 through WGBLn are discharged, thereby reducing the amount of the write current Icell. The voltage levels of the write global bitlines WGBL0 through WGBLn and the level of the write current Icell may be adjusted substantially according to the level of the write pulse Wpulse which is provided to the write global bitlines WGBL0 through WGBLn.

Since the voltage levels of the write global bitlines WGBL0 through WGBLn vary as described above, the conventional nonvolatile memory device may have errors in its read operation. Specifically, there may be a parasitic capacitance Cp1 between each of the write global bitlines WGBL0 through WGBLn and a selected one of local bitlines BL0 through BL3 in each of memory banks 110_1 through 110_8 from which data is read. In addition, there may be another parasitic capacitance Cp2 between each of the write global bitlines WGBL0 through WGBLn and one of the read global bitlines RGBL0 through RGBLn which is adjacent to the corresponding one of the write global bitlines WGBL0 through WGBLn. Therefore, the voltage levels of the write global bitlines WGBL0 through WGBLn may affect the voltage levels of the local bitlines BL0 through BL3 and/or the voltage levels of the read global bitlines RGBL0 through RGBLn.

For example, when the write global bitlines WGBL0 through WGBLn are discharged as the write pulse Wpulse changes from a high level to a low level, the voltage levels of the write global bitlines WGBL0 through WGBLn may be reduced sharply. Accordingly, the voltage levels of the local bitlines BL0 through BL3 and/or the voltage levels of the read global bitlines RGBL0 through RGBLn may be reduced as shown in FIG. 7A by the parasitic capacitances Cp1 and Cp2. When the voltage levels of the local bitlines BL0 through BL3 or the voltage levels of the read global bitlines RGBL0 through RGBLn are reduced as shown in FIG. 7B, a read circuit 145 of the conventional nonvolatile memory device reads resistance having a lower level than the actual resistance of the nonvolatile memory cells MC. That is, due to the change in the voltage levels of the write global bitlines WGBL0 through WGBLn, the read circuit 145 reads resistance different from the actual resistance of the nonvolatile memory cells MC.

Such read errors may occur more frequently when a reset pulse having a relatively high peak level and a relatively narrow pulse width is provided than when a set pulse is provided. This is because the voltage levels of the write global bitlines WGBL0 through WGBLn may change more significantly when a reset pulse having a relatively high peak level and a relatively narrow pulse width is provided than when a set pulse is provided. When a reset pulse is provided, the time required to charge the write global bitlines WGBL0 through WGBLn as the reset pulse changes from a low level to a high level is shorter than the time required to discharge the write global bitlines WGBL0 through WGBLn as the reset pulse changes from a high level to a low level. Therefore, more read errors may occur when the reset pulse changes from a high level to a low level.

However, in a nonvolatile memory device according to some embodiments of the present invention, even when the write pulse Wpulse changes from a high level to a low level, the write global bitlines WGBL0 through WGBLn may not be discharged in a short time. Thus, the voltage levels of the write global bitlines WGBL0 through WGBLn may not be reduced sharply. Consequently, read errors can be reduced. In addition, unlike the write global bitlines WGBL0 through WGBLn, the amount of the write current Icell may be adjusted according to the set pulse or the reset pulse. In particular, when the reset pulse is provided, the amount of the write current Icell is sharply reduced within a short time. Therefore, a nonvolatile memory device according to some embodiments can write data, which corresponds to a predetermined resistance level, to the nonvolatile memory cells MC in a stable manner.

Figure 8:
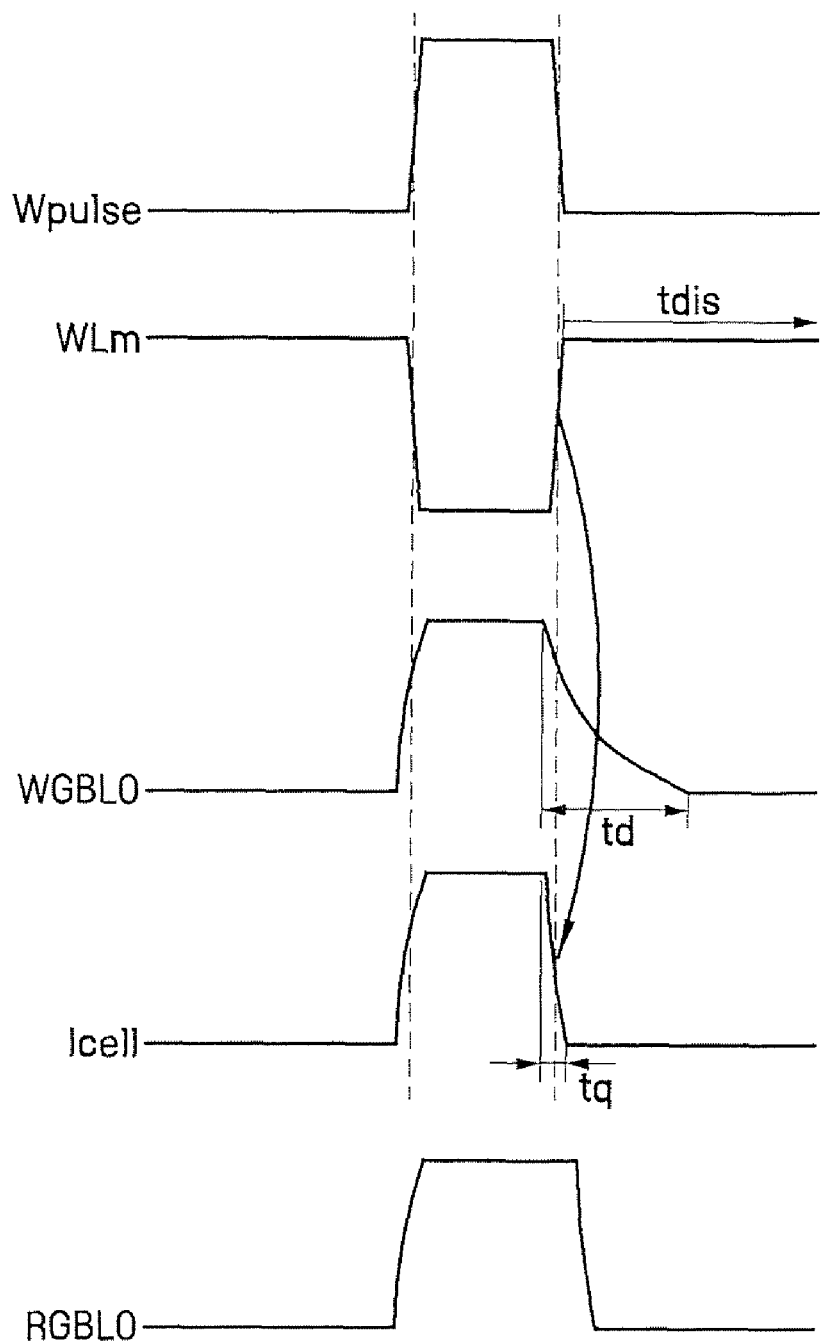
FIG. 8 is a timing diagram illustrating operations of a nonvolatile memory device according to additional embodiments of the present invention.

Hereinafter, a nonvolatile memory device according to some embodiments of the present invention will be described in detail with reference to FIGS. 8 and 9. FIG. 8 is a timing diagram illustrating operations of a nonvolatile memory device according to some embodiments of the present invention.

Referring to FIG. 8, when the nonvolatile memory device is to write data, which corresponds to a predetermined resistance level, to nonvolatile memory cells MC by using a write pulse Wpulse, it provides the write pulse Wpulse to write global bitlines WGBL0 through WGBLn. In response to the write pulse Wpulse, the write global bitlines WGBL0 through WGBLn are charged to a predetermined voltage level and then discharged. In this case, a discharge period td in which the write global bitlines WGBL0 through WGBLn are discharged may at least partially overlap a disable period tdis in which wordlines WL0 through WLm are disabled. In addition, a section in which local bitlines BL0 through BL3 coupled to each of the write global bitlines WGBL0 through WGBLn are discharged may partially overlap the disable period tdis of the wordlines WL0 through WLm.

The disable period tdis of the wordlines WL0 through WLm may begin after the wordlines WL0 through WLm are disabled. Specifically, after voltage levels of the wordlines WL0 through WLm are adjusted to, e.g., a ground voltage level, the wordlines WL0 through WLm may be enabled. Then, the voltage levels of the wordlines WL0 through WLm may be adjusted to, e.g., a level of a step-up voltage source VPP, and thus the wordlines WL0 through WLm may be disabled. The disable period tdis of the wordlines WL0 through WLm begins after the wordlines WL0 through WLm are disabled.

A nonvolatile memory device according to some embodiments of the present invention can write data to the nonvolatile memory cells MC of a plurality of memory banks 110_1 through 110_8 by using the write global bitlines WGBL0 through WGBLn while reading data from the nonvolatile memory cells MC of a second memory bank (one of the memory banks 110_1 through 110_8) by using read global bitlines RGBL0 through RGBLn.

Specifically, in a write operation, a row decoder 120 adjusts voltage levels of the wordlines WL0 through WLm to a ground voltage level and thus enables the wordlines WL0 through WLm. In addition, the write local bitline selection circuits 151 and a global bitline selection circuit 130 (see FIG. 1) select a local bitline (e.g., the local bitline BL0) and a write global bitline (e.g., the write global bitline WGBL0), respectively. Consequently, nonvolatile memory cells MC to be written are selected. Here, the wordlines WL0 through WLm may be selected before the write global bitlines WGBL0 through WGBLn and the local bitlines BL0 through BL3. When necessary, the wordlines WL0 through WLm may be selected after or at the same time as the write global bitlines WGBL0 through WGBLn and the local bitlines BL0 through BL3.

As the write pulse Wpulse provided to the write global bitlines WGBL0 through WGBLn changes from a low level to a high level, the write global bitlines WGBL0 through WGBLn are charged to a predetermined voltage level. As the write global bitlines WGBL0 through WGBLn are charged to the predetermined voltage level, write current Icell flows to the wordlines WL0 through WLm through the nonvolatile memory cells MC which are coupled to the write global bitlines WGBL0 through WGBLn with the local bitlines BL0 through BL3 interposed therebetween.

A level of the write current Icell is increased as the write pulse W changes from a low level to a high level. When the write pulse Wpulse remains at a peak level, the write current Icell also remains at a peak level.

In a nonvolatile memory device according to some embodiments, the voltage levels of the wordlines WL0 through WLm are adjusted to the level of the step-up voltage source VPP before the write pulse Wpulse changes to a low level. Accordingly, the wordlines WL0 through WLm are disabled. Specifically, while the write pulse Wpulse remains at a high level or while the write pulse Wpulse changes from a high level to a low level, the voltage levels of the wordlines WL0 through WLm may be adjusted, for example, from the ground voltage level to the level of the step-up voltage source VPP. Accordingly, the wordlines WL0 through WLm may be disabled. That is, the selection of nonvolatile memory cells MC to be written may be cancelled before the write pulse Wpulse changes to a low level. An exemplary circuit of a nonvolatile memory device, which operates as described above, will be described in detail with reference to FIG. 9.

When the wordlines WL0 through WLm are disabled as described above, the write current Icell cannot flow to the wordlines WL0 through WLm through the nonvolatile memory cells MC. That is, since the wordlines WL0 through WLm are disabled, the level of the write current Icell may drop significantly as shown in FIG. 5, irrespective of the voltage levels of the write global bitlines WGBL0 through WGBLn. On the other hand, a discharge circuit 141_b of a write driver circuit 141 may slowly discharge the write global bitlines WGBL0 through WGBLn to a predetermined voltage level for a relatively longer time than a quenching time tq of the write current Icell, irrespective of the level of the write current Icell. That is, a discharge time td of the write global bitlines WGBL0 through WGBLn and/or a discharge time of the local bitlines BL0 through BL3 which are coupled to the write global bitlines WGBL0 through WGBLn may be longer than the quenching time tq of the write cell Icell that flows through the nonvolatile memory cells MC.

In a nonvolatile memory device according to some embodiments of the present invention, the level of the write current Icell flowing through the nonvolatile memory cells MC may be reduced sharply for a short time while the voltage levels of the local bitlines BL0 through BL3 and/or those of the write global bitlines WGBL0 through WGBLn are reduced slowly for a predetermined period of time. Therefore, the nonvolatile memory device can write data, which corresponds to a predetermined resistance level, to the nonvolatile memory cells MC in a stable manner and reduce its read errors caused by a dramatic change in the voltage levels of the write global bitlines WGBL0 through WGBLn.

Figure 9:
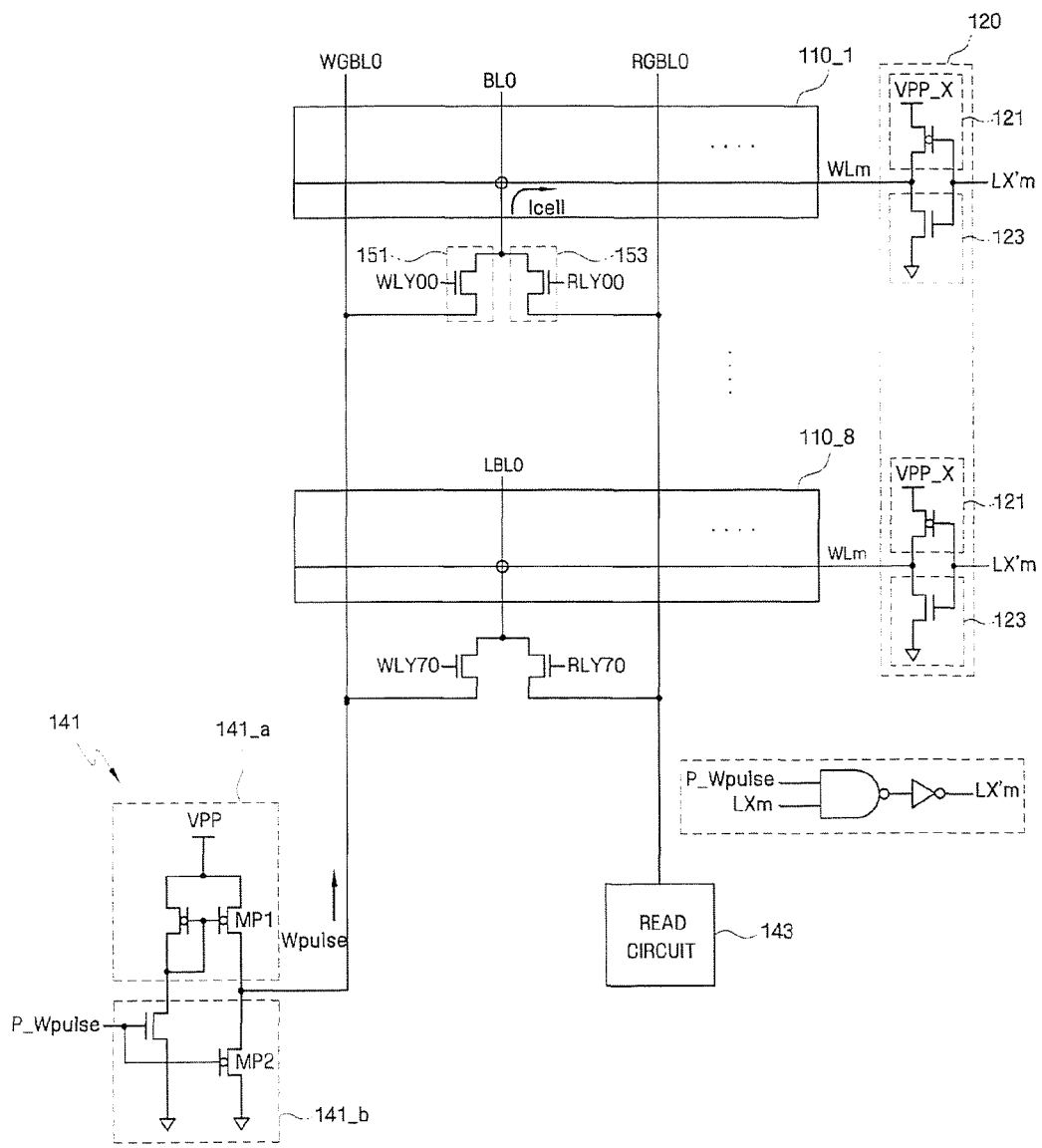
FIG. 9 is a circuit diagram illustrating a nonvolatile memory device according to further embodiments of the present invention.

FIG. 9 is a circuit diagram of a nonvolatile memory device according to some embodiments of the present invention. Specifically, FIG. 9 illustrates a circuit that may perform the operations for driving the nonvolatile memory device illustrated in FIG. 5. The circuit diagram of FIG. 9 is provided for purposes of illustration, and variations thereof may be used according to embodiments of the present invention pertains.

Referring to FIG. 9, the write driver circuit 141 drives the write global bitlines WGBL0 through WGBLn in response to a write signal P_Wpulse and includes a charge circuit 141a and the discharge circuit 141_b. The write signal P_Wpulse may include a reset write signal which provides a reset pulse and a set write signal which provides a set pulse.

The charge circuit 141_a charges the write global bitlines WGBL0 through WGBLn in response to the write signal P_Wpulse and includes a charge transistor MP1 which is coupled between the step-up voltage source VPP and the write global bitlines WGBL0 through WGBLn. Unlike the charge circuit 141_a, the discharge circuit 141_b discharges the write global bitlines WGBL0 through WGBLn in response to the write signal P_Wpulse and includes a discharge transistor MP2 which is coupled between a ground voltage source and the write global bitlines WGBL0 through WGBLn. The charge circuit 141_a charges the write global bitlines WGBL0 through WGBLn in response to the write signal P_Wpulse at a high level, and the discharge circuit 141_b discharges the write global bitlines WGBL0 through WGBLn in response to the write signal P_Wpulse at a low level. In this way, the charge circuit 141a and the discharge circuit 141b perform complementary operations in response to the write signal P_Wpulse.

In particular, in a nonvolatile memory device according to the some embodiments of the present invention, the speed at which the discharge circuit 141_b of the write driver circuit 141 discharges the write global bitlines WGBL0 through WGBLn may be slower than the speed at which the charge circuit 141_a of the write driver circuit 141 charges the write global bitlines WGBL0 through WGBLn. That is, the discharge time td during which the write global bitlines WGBL0 through WGBLn are discharged by the discharge circuit 141_b of the write driver circuit 141 may be longer than a charge time tc during which the write global bitlines WGBL0 through WGBLn are charged by the charge circuit 141_a of the write drive 141. Therefore, the voltage levels of the write global bitlines WGBL0 through WGBLn may be increased significantly for a short time while the write global bitlines WGBL0 through WGBLn are charged. However, the voltage levels of the write global bitlines WGBL0 through WGBLn may not be reduced significantly for a short time while the write global bitlines WGBL0 through WGBLn are discharged. Instead, the voltage levels of the write global bitlines WGBL0 through WGBLn may be reduced slowly.

Various techniques may be used to make the discharge time td during which the write global bitlines WGBL0 through WGBLn are discharged by the discharge circuit 141_b longer than the charge time tc during which the write global bitlines WGBL0 through WGBLn are charged by the charge circuit 141_a. For example, a signal having a lower level than that of a signal transmitted to a gate of the charge transistor MP1 may be transmitted to a gate of the discharge transistor MP2. Alternatively, the resistance of the discharge transistor MP2 may be increased to be greater than the resistance of the charge transistor MP1. To increase the resistance of the discharge transistor MP2 to be greater than that of the charge transistor MP1, a threshold voltage Vth may be increased by doping a channel region of the discharge transistor MP2 to a lower concentration than that of a channel region of the charge transistor MP1. In addition, the length of the channel region of the discharge transistor MP2 may be increased, or a width of the channel region of the discharge transistor MP2 may be reduced in order to reduced a ratio of the width to the length (W/L) of the channel region of the discharge transistor MP2 and thus make the charge transistor MP1 larger than the discharge transistor MP2.

The write local bitline selection circuit 151 selectively couples the write global bitlines WGBL0 through WGBLn to the local bitlines BL0 through BL3 by using a write local bitline selection signal (e.g., WLY00).

By using wordline selection signals LX0 through LXm and the write signal P_Wpulse, the row decoder 120 adjusts the voltage levels of the wordlines WL0 through WLm and thus selects at least one of the wordlines WL0 through WLm. The row decoder 120 includes a plurality of pull-up (PU) circuits 121 and a plurality of pull-down (PD) circuits 123.

The PU circuits 121 adjust the voltage levels of the wordlines WL0 through WLm to, e.g., the level of a step-up voltage source VPP_X, by using the wordline selection signals LX0 through LXm and the write signal P_Wpulse, thereby disabling the wordlines WL0 through WLm. Each of the PU circuits 121 may include a p-channel metal oxide semiconductor (PMOS) transistor, which is coupled between the wordlines WL0 through WLm and the step-up voltage source VPP_X.

The PD circuits 123 adjust the voltage levels of the wordlines WL0 through WLm to, e.g., the ground voltage level, in response to the wordline selection signals LX0 through LXm and the write signal P_Wpulse, thereby disabling the wordlines WL0 through WLm. Each of the PD circuits 123 may include an n-channel metal oxide semiconductor (NMOS) transistor, which is coupled between a ground voltage source and the wordlines WL0 through WLm.

As shown in FIG. 9, a signal obtained after an AND operation is performed on the write signal P_Wpulse and each of the wordline selection signals LX0 through LXm is transmitted to a gate of the PMOS transistor of each of the PU circuits 121 and a gate of the NMOS transistor of each of the PD circuits 123. A signal LX transmitted to each of the PU circuits 121 and each of the PD circuit 123 in response to the write signal P_Wpulse and each of the wordline selection signals LX0 through LXm may be summarized as shown in Table 1 below.

TABLE 1

| LX       | L | L | H | H |
|----------|---|---|---|---|
| P_WPULSE | L | H | H | L |
| LX'      | L | L | H | L |

Referring to Table 1, only when the write signal P_Wpulse and each of the wordline selection signals LX0 through LXm are at a high level, the signal LX' provided to each of the PU circuits 121 and each of the PD circuits 123 becomes a high level. Accordingly, the PU circuits 121 are disabled, and the PD circuits 123 are enabled. As a result, the voltage levels of the wordlines WL0 through WLm are adjusted to the ground voltage level, and thus the wordlines WL0 through WLm are enabled.

On the other hand, as the write signal P_Wpulse changes from a high level to a low level, the signal LX', which is transmitted to each of the PU circuits 121 and each of the PD circuit 123, becomes a low level, irrespective of the level of each of the wordline selection signals LX0 through LXm. Accordingly, the PD circuits 123 are disabled, and the PU circuits 121 are enabled. As a result, the levels of the wordlines WL0 through WLm are adjusted to the level of the step-up voltage source VPP_X, and thus the wordlines WL0 through WLm are disabled.

Therefore, as shown in FIG. 8, the level of the write current Icell may drop significantly, irrespective of the voltage levels of the write global bitlines WGBL0 through WGBLn. In addition, since the discharge circuit 141_b of the write driver circuit 141 discharges the write global bitlines WGBL0 through WGBLn relatively slowly in response to the write signal P_Wpulse at a low level, the voltage levels of the write global bitlines WGBL0 through WGBLn may not be sharply reduced for a short time. Instead, the voltage levels of the write global bitlines WGBL0 through WGBLn may be reduced slowly for a predetermined period of time.

Figure 10:
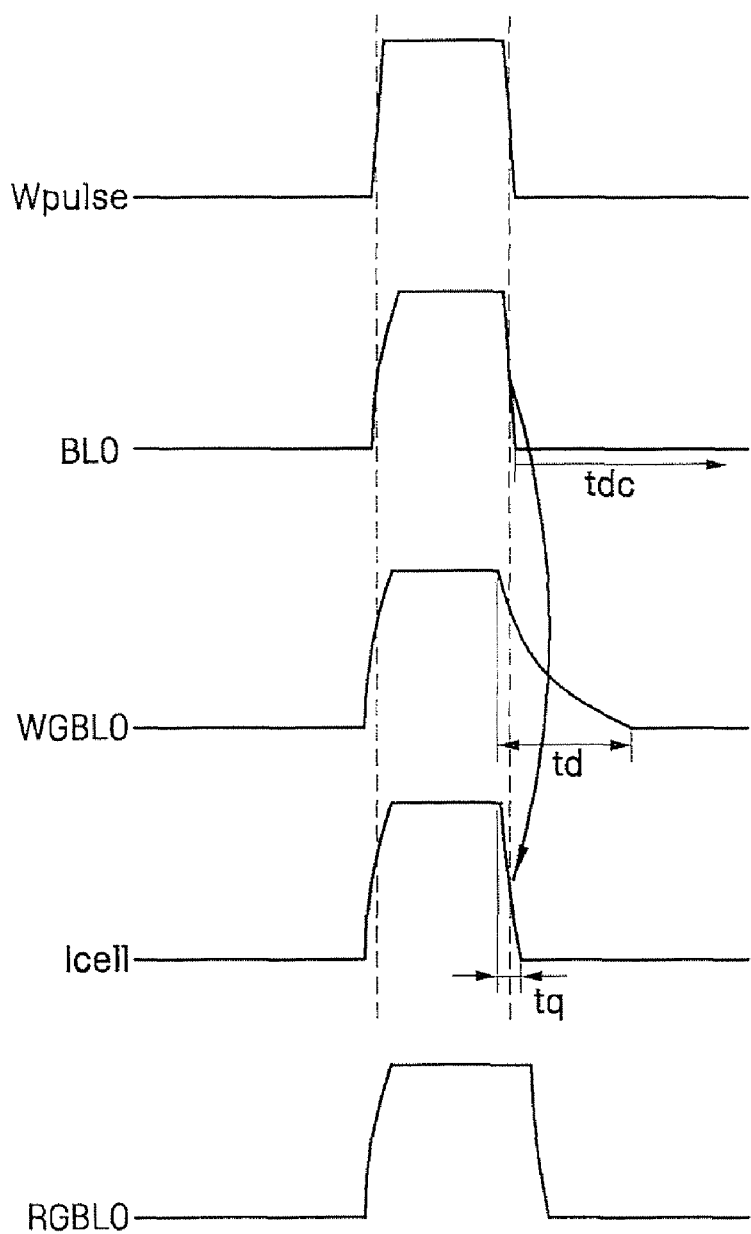
FIG. 10 is a timing diagram illustrating operations of a nonvolatile memory device according to further embodiments of the present invention.

Hereinafter, a nonvolatile memory device according to further embodiments of the present invention will be described with reference to FIGS. 10 and 11. FIG. 10 is a timing diagram illustrating the operation of a nonvolatile memory device of FIG. 11.

Figure 11:
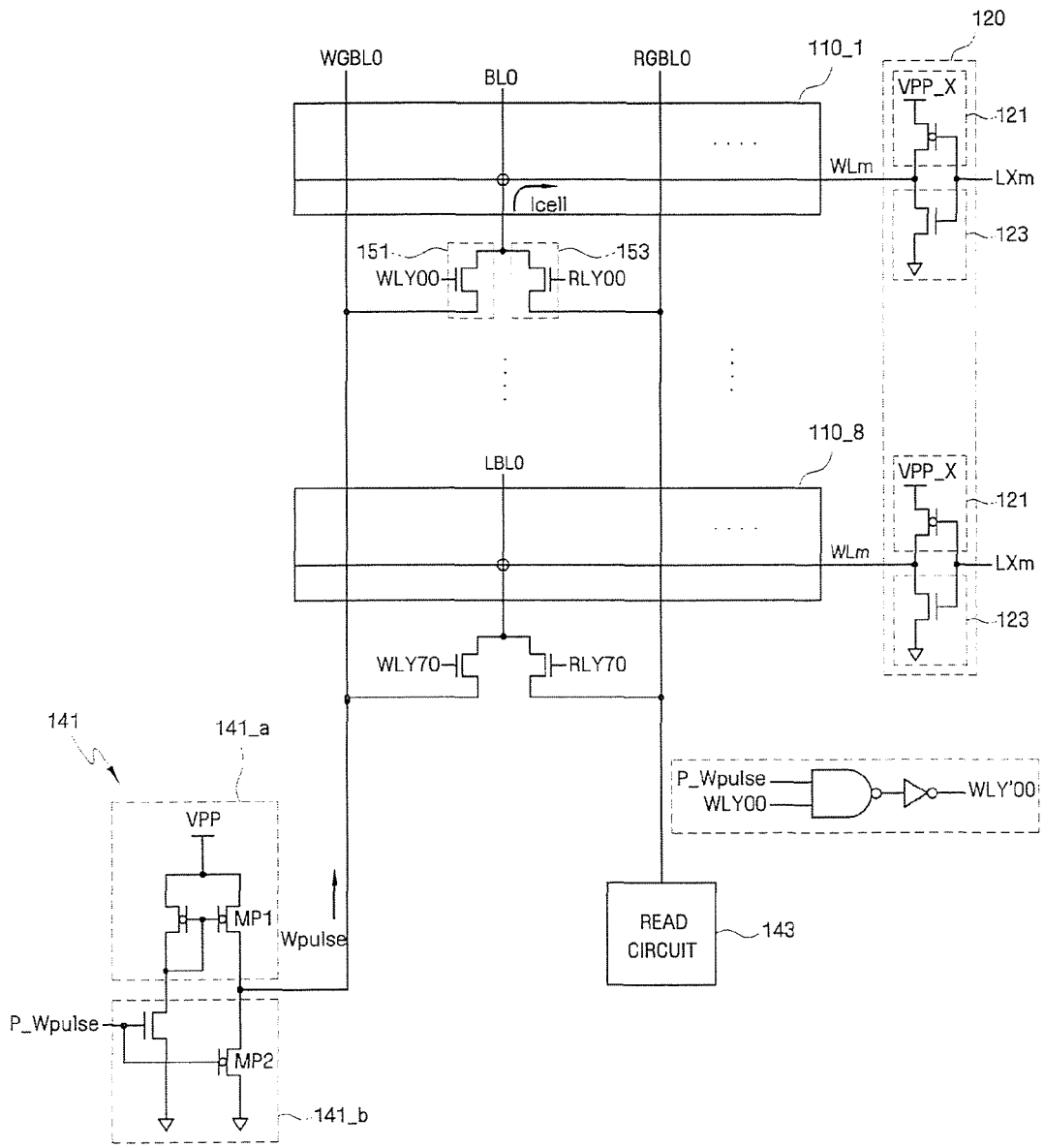
FIG. 11 is a schematic diagram of a nonvolatile memory device according to additional embodiments of the present invention.

The nonvolatile memory device of FIG. 11 is different from the nonvolatile memory device of FIG. 9 in that it causes levels of write global bitlines WGBL0 through WGBLn, write current Icell, and read global bitlines RGBL0 through RGBLn to change as shown in FIG. 5 by using the decoupling of local bitlines BL0 through BL3 from each of the write global bitlines WGBL0 through WGBLn. For simplicity, a detailed description of operations substantially identical to those of the nonvolatile memory device of FIG. 8 will be omitted.

Referring to FIG. 10, when the nonvolatile memory device is to write data that corresponds to a predetermined resistance level to nonvolatile memory cells MC by using a write pulse Wpulse, it provides the write pulse Wpulse to the write global bitlines WGBL0 through WGBLn. In response to the write pulse Wpulse, the write global bitlines WGBL0 through WGBLn are charged to a predetermined voltage level and then discharged. In this case, a discharge period td in which the write global bitlines WGBL0 through WGBLn are discharged may at least partially overlap a decoupling period tdc in which the local bitlines BL0 through BL3 are decoupled from each of the write global bitlines WGBL0 through WGBLn.

The decoupling period tdc in which the local bitlines BL0 through BL3 are decoupled from each of the write global bitlines WGBL0 through WGBLn may be a section that begins after a selected one of the local bitlines BL0 through BL3 is coupled to and then decoupled from each of the write global bitlines WGBL0 through WGBLn by each of write local bitline selection circuits 151.

The nonvolatile memory device can write data to the nonvolatile memory cells MC of a plurality of memory banks 110_1 through 110_8 by using the write global bitlines WGBL0 through WGBLn while reading data from the nonvolatile memory cells MC of a second memory bank (one of the memory banks 110_1 through 110_8) by using the read global bitlines RGBL0 through RGBLn.

Specifically, in the write operation of the nonvolatile memory device, a row decoder 120 adjusts voltage levels of the wordlines WL0 through WLm to a ground voltage level and thus enables the wordlines WL0 through WLm. In addition, each of the write local bitline selection circuits 151 and a global bitline selection circuit 130 (see FIG. 1) select a local bitline (e.g., the local bitline BL0) and a write global bitline (e.g., the write global bitline WGBL0), respectively.

As the write pulse Wpulse provided to the write global bitlines WGBL0 through WGBLn changes from a low level to a high level, the write global bitlines WGBL0 through WGBLn are charged to a predetermined voltage level. As the write global bitlines WGBL0 through WGBLn are charged to the predetermined voltage level, the write current Icell flows to the wordlines WL0 through WLm through the nonvolatile memory cells MC which are coupled to the write global bitlines WGBL0 through WGBLn with the local bitlines BL0 through BL3 interposed therebetween.

The local bitlines BL0 through BL3 are decoupled from each of the write global bitlines WGBL0 through WGBLn before the write pulse Wpulse changes to a low level. Specifically, while the write pulse Wpulse remains at a high level or while the write pulse Wpulse changes from a high level to a low level, the local bitlines BL0 through BL3 are decoupled from each of the write global bitlines WGBL0 through WGBLn by each of the write local bitline selection circuits 151. That is, the selection of nonvolatile memory cells MC to be written may be cancelled before the write pulse Wpulse changes to a low level. An exemplary circuit of the nonvolatile memory device, which operates as described above, will be described in detail with reference to FIG. 11.

When the local bitlines BL0 through BL3 are decoupled from each of the write global bitlines WGBL0 through WGBLn as described above, the level of the write current Icell, which flows to the wordlines WL0 through WLm through the nonvolatile memory cells MC, is reduced. That is, since the local bitlines BL0 through BL3 are decoupled from each of the write global bitlines WGBL0 through WGBLn or the nonvolatile memory cells MC are decoupled from each of the write global bitlines WGBL0 through WGBLn, the level of the write current Icell may drop significantly as shown in FIG. 8, irrespective of the voltage levels of the write global bitlines WGBL0 through WGBLn.

On the other hand, a discharge circuit 141_b of a write driver circuit 141 may slowly discharge the write global bitlines WGBL0 through WGBLn to a predetermined voltage level for a relatively longer time than a quenching time tq of the write current Icell, irrespective of the level of the write current Icell. That is, a discharge time td of the write global bitlines WGBL0 through WGBLn may be longer than the quenching time tq of the write cell Icell that flows through the nonvolatile memory cells MC or a discharge time of the local bitlines BL0 through BL3.

The level of the write current Icell flowing through the nonvolatile memory cells MC and/or the voltage levels of the local bitlines BL0 through BL3 may be reduced sharply for a short time while the voltage levels of the write global bitlines WGBL0 through WGBLn are reduced slowly for a predetermined period of time. Therefore, the nonvolatile memory device can write data, which corresponds to a predetermined resistance level, to the nonvolatile memory cells MC in a stable manner and reduce its read errors caused by a dramatic change in the voltage levels of the write global bitlines WGBL0 through WGBLn.

FIG. 11 is a circuit diagram of a nonvolatile memory device according to further embodiments of the present invention. Specifically, FIG. 11 is a circuit diagram illustrating implementation of the operations illustrated in FIG. 10. The circuit diagram of FIG. 11 is provided for purposes of illustration, and variations thereof may be used.

The circuit diagram of FIG. 11 is substantially similar to that of FIG. 9. However, the circuitry of FIG. 11 differs in that each of the write local bitline selection circuits 151 of FIG. 11 couples each of the write global bitlines WGBL0 through WGBLn to a selected one of the local bitlines BL0 through BL3 by using a write local bitline selection signal (e.g., WLY00) and the write signal P_Wpulse. Unlike in the embodiments of FIG. 9, the row decoder 120 may adjust the voltage level of each of the wordlines WL0 through WLm by using a wordline selection signal (e.g., LXm) in the embodiments of FIG. 11. For simplicity, a description of elements substantially identical to those of FIG. 9 will be omitted.

Referring to FIG. 11, each of the write local bitline selection circuits 151 selectively couples each of the write global bitlines WGBL0 through WGBLn to the local bitlines BL0 through BL3 by using the write signal P_Wpulse and one of write local bitline selection signals WLY00 through WLY73. Each of the write local bitline selection circuits 151 may include a plurality of selectors (e.g., NMOS transistors) which are interposed between each of the write global bitlines WGBL0 through WGBLn and the local bitlines BL0 through BL3.

As shown in FIG. 1, each of signals WLY'00 through WLY'73 obtained after AND operations are performed on the write signal P_Wpulse and the write local bitline selection signals WLY00 through WLY73 may be transmitted to gates of the selectors of a corresponding one of the write local bitline selection circuits 151. The signals WLY'00 through WLY'73 transmitted to the selectors in response to the write signal P_Wpulse and the write local bitline selection signals WLY00 through WLY73 may be summarized as shown in Table 2 below.

TABLE 2

| WLY | L | L | H | H |
|---|---|---|---|---|
| P_Wpulse | L | H | H | L |
| WLY' | L | L | H | L |

Referring to Table 2, only when the write signal P_Wpulse and each of the write local bitline selection signals WLY00 through WLY73 are at a high level, the signals WLY'00 through WLY'73 transmitted to the selectors of the write local bitline selection circuits 151 become a high level. Accordingly, the selectors are enabled, and thus each of the write global bitlines WGBL0 through WGBLn is coupled to the local bitlines BL0 through BL3 and/or the nonvolatile memory cells MC.

On the other hand, as the write signal P_Wpulse changes from a high level to a low level, the signals WLY'00 through WLY'73 transmitted to the selectors of the write local bitline selection circuits 151 become a low level irrespective of the levels of the write local bitline selection signals WLY00 through WLY73. Accordingly, the selectors are disabled, and thus each of the write global bitlines WGBL0 through WGBLn is decoupled from the local bitlines BL0 through BL3 and/or the nonvolatile memory cells MC.

Therefore, as shown in FIG. 10, the level of the write current Icell may drop significantly, irrespective of the voltage levels of the write global bitlines WGBL0 through WGBLn. In addition, since the discharge circuit 141_*b* of the write driver circuit 141 discharges the write global bitlines WGBL0 through WGBLn relatively slowly in response to the write signal P_Wpulse at a low level, the voltage levels of the write global bitlines WGBL0 through WGBLn may not be sharply reduced for a short time. Instead, the voltage levels of the write global bitlines WGBL0 through WGBLn may be reduced slowly for a predetermined period of time.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

That which is claimed is:

1. A nonvolatile memory device comprising:
a plurality of memory banks, each comprising a plurality of nonvolatile resistive memory cells;
a write global bitline shared by the memory banks;
a read global bitline shared by the memory banks; and
a control circuit configured to write data to a selected nonvolatile memory cell in a first memory bank using the write global bitline while reading data from a selected nonvolatile memory cell in a second memory bank using the read global bitline such that a discharge time period of the write global bitline is longer than a quenching time period of a write current which flows through the nonvolatile memory cell of the first memory bank.

2. The memory device of claim 1, wherein the discharge time period is at least twice the quenching time period.

3. The memory device of claim 1, wherein the control circuit comprises a write driver circuit comprising a charge circuit configured to charge the write global bitline and a discharge circuit configured to discharge the write global bitline, wherein a time period during which the write global bitline is discharged by the discharge circuit is longer than a time period during which the write global bitline is charged by the charge circuit.

4. The memory device of claim 1, further comprising:
a plurality of local bitlines, respective ones of which are coupled to respective columns of the nonvolatile memory cells in the plurality of memory banks; and
wherein the control circuit comprises a plurality of write local bitline selection circuits configured to concurrently couple at least two local bitlines to the write global bitline.

5. The memory device of claim 1, wherein the data written to the selected nonvolatile memory cell is reset data.

6. The memory device of claim 1, wherein the nonvolatile memory cells are phase-change random access memory (PRAM) cells.

* * * * *